United States Patent
Fackenthal

(10) Patent No.: US 7,356,755 B2
(45) Date of Patent: Apr. 8, 2008

(54) ERROR CORRECTION FOR MULTI-LEVEL CELL MEMORY WITH OVERWRITE CAPABILITY

(75) Inventor: Richard E. Fackenthal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 10/687,124

(22) Filed: Oct. 16, 2003

(65) Prior Publication Data

US 2005/0086574 A1   Apr. 21, 2005

(51) Int. Cl.
G11C 29/00 (2006.01)
(52) U.S. Cl. ........................................ 714/766
(58) Field of Classification Search ................. 714/763
See application file for complete search history.

(56) References Cited

U.S. PATENT DOCUMENTS

| | | | | |
|---|---|---|---|---|
| 5,511,026 A * | 4/1996 | Cleveland et al. | ..... | 365/189.09 |
| 5,671,388 A * | 9/1997 | Hasbun | ....................... | 711/103 |
| 6,363,008 B1 * | 3/2002 | Wong | ..................... | 365/185.03 |
| 6,549,457 B1 | 4/2003 | Srinivasan et al. | .... | 365/185.03 |
| 2003/0053333 A1 | 3/2003 | Rudelic et al. | ........ | 365/185.03 |

OTHER PUBLICATIONS

Ricco et al. "Non-volatile Multilevel Memories for Digital Applications," IEEE, pp. 2399-2421, Dec. 1998.*
*Construction of Polyvalent Error Control Codes for Multilevel Memories*; Stefano Gregori, Pietro Ferrari, Rino Micheloni and Guido Torelli, pp. 751-754; 2000.
*An Error Control Code Scheme for Multilevel Flash Memories*; Stefano Gregori, Osama Khouri, Rino Micheloni and Guido Torelli; pp. 45-49; 2001.
*Using Non-Volatile Memories for Disk Caching*; John I. Garney; U.S. Appl. No. 10/287,115, filed Nov. 4, 2002.

* cited by examiner

*Primary Examiner*—Guy J. Lamarre
(74) *Attorney, Agent, or Firm*—Trop, Pruner & Hu, P.C.

(57) ABSTRACT

A multi-level cell memory that includes storing data in multiple cell densities is disclosed. The multi-level cell memory selectively includes error correction code. The multi-level cell memory may also include splitting cells into higher bits and lower bits in codewords.

44 Claims, 3 Drawing Sheets

ERROR CORRECTION FOR MULTI-LEVEL CELL MEMORY WITH OVERWRITE CAPABILITY

BACKGROUND

This invention relates to semiconductor memories and particularly to multi-level cell (MLC) flash memories with error correction code.

A flash memory cell, as well as other types of memory cells, may be configurable to store more than one voltage threshold level (VT) in one cell. Depending on the number of threshold levels, more than one bit may be stored per cell. For example, a memory cell capable of storing four threshold levels is capable of storing two bits per cell.

Aggressive scaling of process technology and demand for higher density chips present increasing reliability challenges to multi-level cell memory product development. Error correction codes (ECC) are used throughout the electronics, communications, and memory industries to counter low-level reliability problems while improving performance or reducing cost per bit. A typical error correction method involves calculating parity bits for a codeword of data. For example, a 256 bit codeword may have parity bits associated with it. The parity bits are calculated based on an error correction code.

A fundamental problem with designing error correction codes into a MLC flash memory is the one-way nature of flash programming. Error correction codes work on codewords (or other data segments). Parity bits (or parity check bits) may be generated and then associated with a codeword. Each time that a codeword is rewritten, the associated parity bits will have to change.

However, the parity bit may only change from a one to a zero because rewriting a bit from zero to one in flash memory involves a block erase. In other words, error correction codes are not practical with flash memories, which may be rewritten several times, since the associated parity bits may need to change from zero to one in response to the rewriting of a codeword.

Therefore, there is a need for alternative ways to implement error correction methods in flash memories, while allowing overwriting.

DETAILED DESCRIPTION

Figure 1:
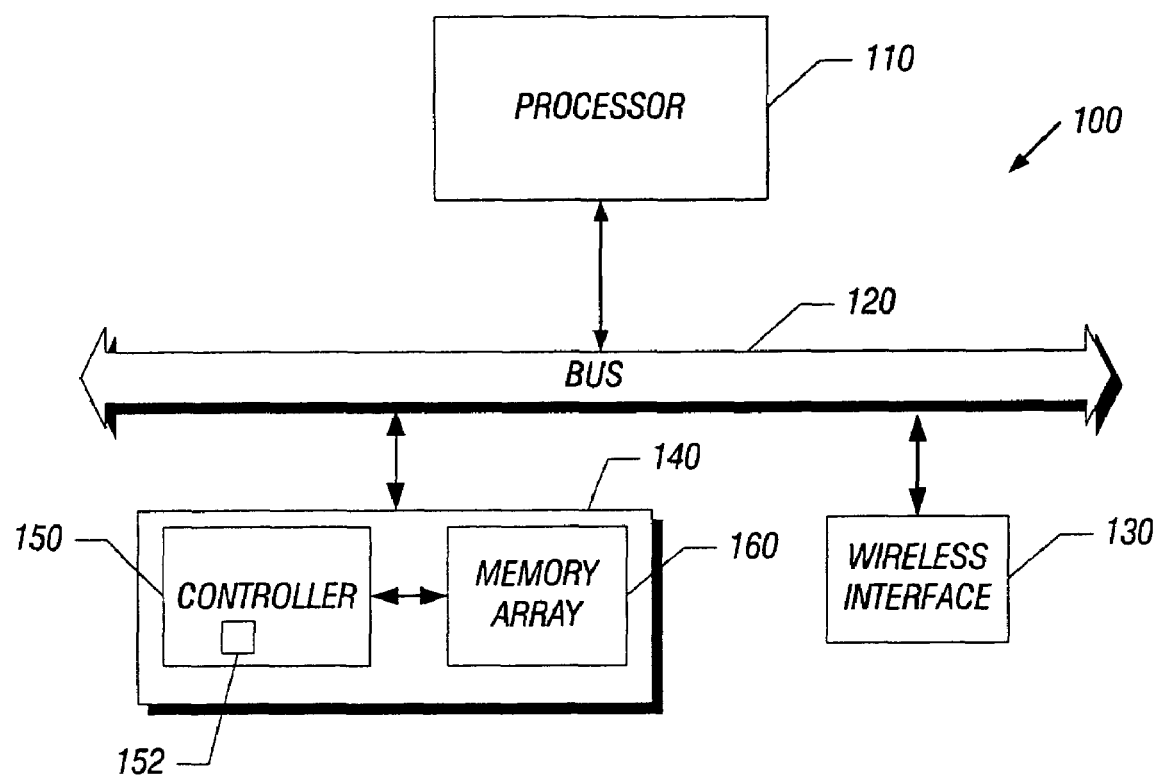
FIG. 1 is a block diagram of a system which may have one embodiment of the present invention.

Referring to FIG. 1, an electronic system 100 may include a processor 110 coupled to a system bus 120. A multi-level cell memory 140 may be coupled through the bus 120 to the processor 110. Similarly, a wireless interface 130 may be coupled to the processor 110 through bus 120. The multi-level cell memory 140 may include a controller 150 and a memory array 160. The controller 150, in one embodiment, may store a write algorithm 152.

In one embodiment, the system 100 may enable wireless network access using a wireless interface 130. The wireless interface 130 may be a radio frequency interface, as one example, including a transceiver and an antenna. The antenna may be a dipole antenna, or a helical antenna as two examples. For example, the wireless interface 130 may enable access to a server or a client on a client server system over a suitable wireless medium, such as a radio frequency medium. However, the present invention is not limited to a processor-based system that permits wireless access.

A multi-level cell memory may operate at a density of bits per cell that is less than the density capacity of the cell. Thus, one cell may be at a higher density than another cell in the same array, even though both cells have the same capacity to store a given number of bits greater than one bit.

Figures 2, 3, 4:
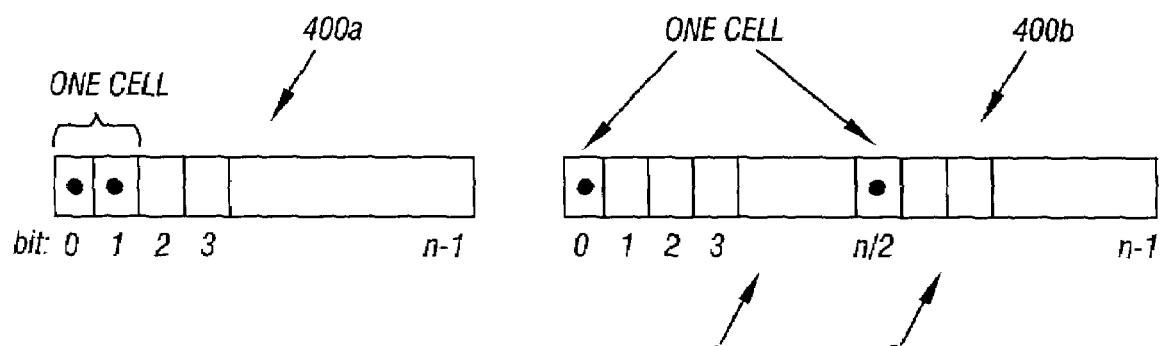
FIG. 2 is a table of logic states and voltage thresholds of one embodiment of the present invention.
FIG. 3 depicts bit positions in memory cells of one embodiment of the invention.
FIG. 4 is a depiction of a memory map in accordance with one embodiment of the present invention.

In the example of FIG. 2, four voltage threshold levels L0, L1, L2, and L3 are illustrated. L0 corresponds to a data bit pattern of 11 and L3 corresponds to the bit pattern 00. In one example, a higher density mode may utilize all four levels, thus storing two bits of data per multi-level cell. In one embodiment, a lower density mode may utilize just two voltage threshold levels such as the levels L0 and L3 and, in such case, only one bit of data is stored in the lower density mode.

In other examples, higher density modes may include utilizing any number of voltage threshold levels up to and including the maximum number of levels that the cell may handle. Similarly, a lower density mode may include using any smaller number of threshold voltage levels, when compared to a higher density mode.

In the example of FIG. 2, the high bit is the more significant bit and the low bit is the less significant bit. If only one bit is stored, using levels L0 and L3, the low bit could effectively be ignored.

In multi-level cell codewords, bits stored in the same cell may be split apart so that they are not located next to each other in the codeword. In one embodiment, more significant bits of a codeword may be segregated from less significant bits. For example, the bits of a two bit multi-level cell may be split such that the more significant bits of the multi-level cells are located on a first side of a codeword while the less significant bits are located on the opposite side of the codeword. In effect, more significant bits may be grouped together within the codeword even though those bits may be from different cells. The segregation of more significant bits within a codeword may ultimately facilitate more ready access to the more significant bits when the codeword is in a lower density mode.

A bit arrangement for codeword 400a is shown on the left in FIG. 3. A codeword 400 has n bits. In the codeword 400a, the two bits of the multi-level cells may be logically adjacent in the codeword. In this example, bits 0 (more significant bit) and 1 (the less significant bit) of "one cell" may be stored side-by-side in the codeword 400a.

In another bit arrangement, codeword 400b on the right in FIG. 3, bits from the same cell are split apart within the codeword. More significant bits from cells making up the codeword 400b may be in section A of the codeword 410 and the less significant bits of the same cells may be in the section B of a codeword 400b. In one embodiment, the more significant bits are segregated in the first half of the codeword from the less significant bits in the second half of the codeword.

In this embodiment, the controller 150 may see n/2 valid bits in the first half of the codeword and n/2 less significant bits in the second half of the codeword. Flash file systems (which may include low level media drivers) then may advantageously ignore the section B of the codeword 400b, in this example.

In general, more significant bits from a number of cells may be packed next to one another in a first codeword section. Then less significant bits may be placed in a different or second codeword section. The order, arrangement, and number of such codeword sections is open to wide variations.

Part of the array 160 (FIG. 1) may include a memory space 500 storing eight codewords A-H as shown in FIG. 4. A density flag 510 may be associated with each codeword in one embodiment. If more than two bit densities per cell are utilized, the density flag may use two or more bits in this embodiment. In one embodiment, when the density flag 510 is "1," the codeword is in a higher density mode (such as two bits per cell). Conversely, when the write density flag 510 is "0," the codeword is in a lower density mode (such as one bit per cell). Of course, other coding protocols may be utilized to indicate the selected bit density. When a codeword is in a lower density mode, the codeword (such as the codeword C and E), may have invalid areas (illustrated in FIG. 4 by the slashed areas) for the less significant bits, in this example.

In one embodiment, using at least one higher and at least one lower density mode, when a block of memory is erased, all codewords in the block default to the higher density mode and all write density flags are reset to indicate the higher density mode. Those erased cells are then available to be written to a selected density mode such as a lower density mode.

In a lower density mode, the less significant bits 530 can be filled with either the same data as the more significant bits 520, or all zeros, or all ones. Filling the less significant bits 330 with the same data as the more significant bits 320 may disguise the lower density mode from the internal multi-level cell programming algorithm.

When the system reads back a lower density mode codeword, the high bit data 520 may be received. Since the more significant bits 320 are reliable to an L0 or L3 voltage threshold in this example, error correction code (ECC) may not be used. Since error correction code (ECC) is not executed, the system 100 may write the more significant bits of the lower density mode codewords many times (writing only from a "1" to a "0").

Parity bits $p^i$, $0 \leq i \leq m$, may be included in the column 540 of the codewords A, B, E, F, G and H in the higher density mode while no parity bits are used in the codewords C and E that are in the lower density mode in one embodiment. Since the lower density mode codewords, such as the codewords C and E in one example, do not have parity bits associated with them, they may be overwritten in this embodiment.

Figure 5:
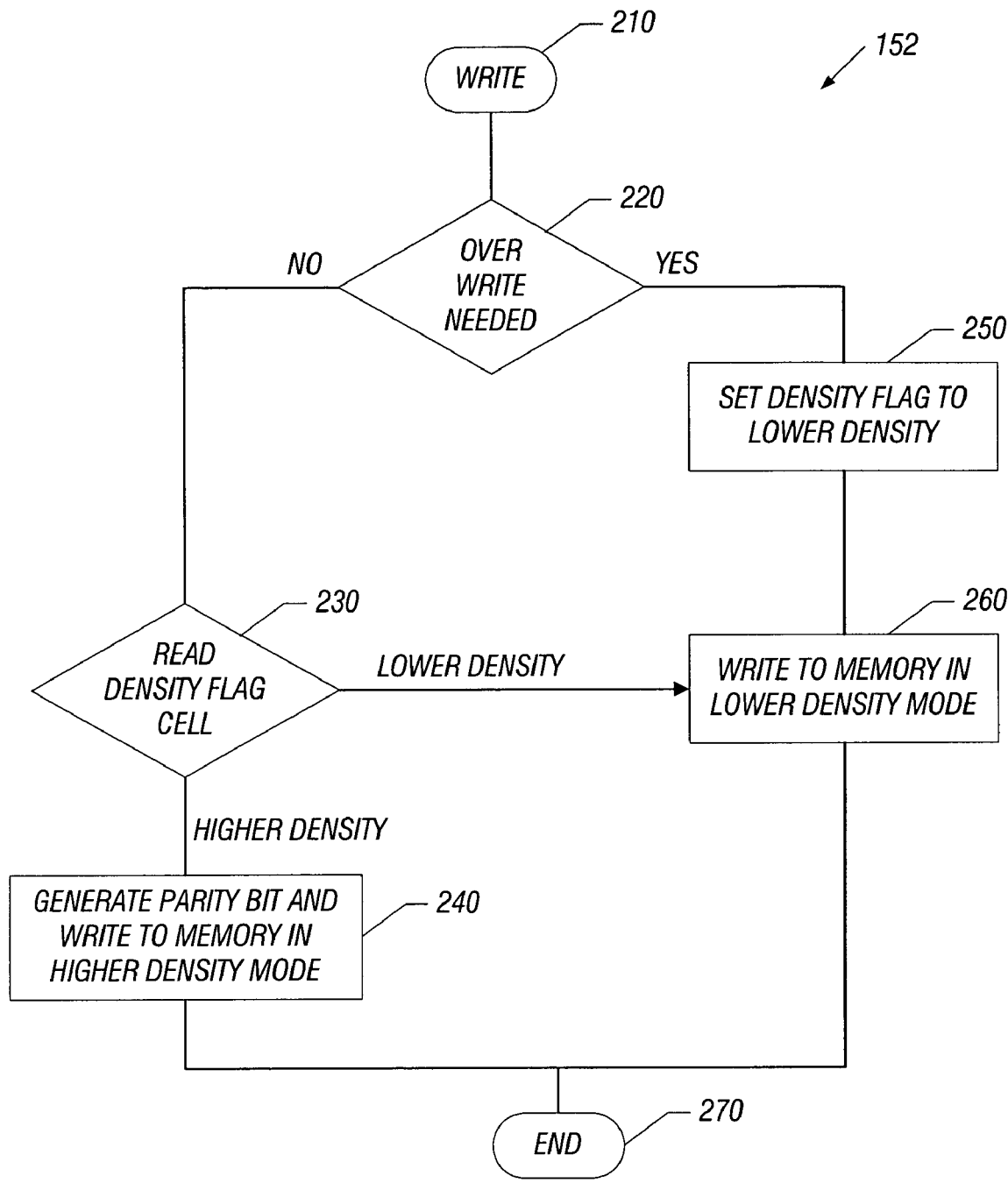
FIG. 5 is a flowchart implementing aspects in accordance with one embodiment of the present invention.

Referring to FIG. 5, the write algorithm 152 may be implemented in software, firmware, microcode or hardware. Initially, the write algorithm 152, that may be executed by the controller 150, determines if a particular codeword may need to be rewritten, as shown block 220. In one embodiment, if overwriting is needed, then the memory 140 sets a "lower density" flag as shown in block 250. The memory 140 may then complete the re-write by writing to memory in a lower density mode as shown in block 260.

In cases where overwriting may be necessary, it is advantageous to use the lower density mode thereby eliminating the need for error correction codes. This is because in the lower density mode, the likelihood of an error is less and therefore it is more feasible to dispense with the error correcting code.

With the error correcting code, it is generally not feasible to overwrite the data in flash memory. Thus, to enable overwriting, a lower density may be selected. Selecting the lower density improves the reliability of the stored data reducing the need for error correcting code.

During a write, the memory 140 may then read a density flag to see if the subject codeword has been flagged as a lower density codeword as shown in diamond 230. In one embodiment, if the codeword has been flagged as a lower density codeword, then the memory 140 writes to the array 160 in a lower density mode, as indicated in block 260. If the codeword has not been flagged as a lower density codeword, then the memory 140 may generate a parity bit (or other ECC) and writes to memory in a higher density mode, as indicated in block 240. In one embodiment, this would complete the write as indicated in block 270.

An embodiment is illustrated in which software control is utilized. Of course, hardwired embodiments may be utilized as well. In addition, while embodiments of the present invention are described in connection in which only one write mode status bit are utilized, the present invention is applicable to any number of write mode status bits greater than one and multi-level memory cells with any number of levels.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   selectively storing data in a memory array at different densities per cell; and
   implementing error correction depending on the density of data storage;
   wherein implementing error correction depending on the density of data storage includes determining whether data is in a higher or lower density mode; and
   if the data is in a higher density mode, implementing error correction code; and
   if the data is in a lower density mode, omitting error correction code.

2. The method of claim 1 including selectively storing data in a memory at different densities per cell by using different numbers of threshold voltage levels in a given cell.

3. The method of claim 2 including using a higher density mode with double the number of threshold levels as a lower density mode.

4. The method of claim 3 including using a higher density mode with four threshold levels and a lower density mode using two threshold levels.

5. The method of claim 1 including using a flag to indicate whether or not the data is in a lower or higher density mode.

6. The method of claim 1 including allowing overwriting when the data is stored in the lower density mode.

7. The method of claim 6 including preventing overwriting when the data is stored in the higher density mode.

8. The method of claim 1 including allowing overwriting of stored data when error correcting codes are not provided for that data.

9. The method of claim 1 including providing a multi-level memory cell array having a capacity of at least four levels.

10. The method of claim 9 including using at least two bits to represent said at least four levels.

11. The method of claim 10 including using one of said bits as a more significant bit and the other of said bits as a less significant bit.

12. The method of claim 11 wherein data from at least two cells forms a codeword and grouping the more significant bits from different cells together.

13. The method of claim 12 including providing more significant bits in one half of a word and less significant bits in the other half of a word.

14. An article comprising a medium storing instructions that, if executed, enable a processor-based system to:
selectively store data in a memory array at different densities per cell; and
implement error correction depending on the density of data storage;
wherein to implement error correction depending on the density of data storage includes determining whether data is in a higher or lower density mode; and
if the data is in a higher density mode, implement error correction; and
if the data is in a lower density mode, omit error correction.

15. The article of claim 14 further storing instructions that, if executed, enable the system to selectively store data in a memory at different densities per cell by using different numbers of threshold voltage levels in a given cell.

16. The article of claim 15 further storing instructions that, if executed, enable the system to use a higher density mode with double the number of threshold levels as a lower density mode.

17. The article of claim 16 further storing instructions that, if executed, enable the system to use a higher density mode with four threshold levels and a lower density mode using two threshold levels.

18. The article of claim 14 further storing instructions that, if executed, enable the system to use a flag to indicate whether or not the data is in a lower or higher density mode.

19. The article of claim 18 further storing instructions that, if executed, enable the system to prevent overwriting when data is stored in the higher density mode.

20. The article of claim 14 further storing instructions that, if executed, enable the system to allow overwriting when the data is stored in a higher density mode.

21. The article of claim 14 further storing instructions that, if executed, enable the system to allow overwriting of stored data when error correcting codes are not provided for that data.

22. The article of claim 14 further storing instructions that, if executed, enable the system to provide a multi-level memory cell array having a capacity of at least four levels.

23. The article of claim 22 further storing instructions that, if executed, enable the system to use at least two bits to represent said at least four levels.

24. The article of claim 23 further storing instructions that, if executed, enable the system to use one of said bits as a more significant bit and the other of said bits as a less significant bit.

25. The article of claim 24 wherein data from at least two cells forms a codeword and further storing instructions that, if executed, enable the system to group the more significant bits from different cells together.

26. The article of claim 25 further storing instructions that, if executed, enable the system to provide more significant bits in one half of a codeword and less significant bits in the other half of a codeword.

27. A memory comprising:
a memory array; and
a controller coupled to said memory array to selectively store data in the memory array at different densities per cell and to implement error correction depending on the density of data storage;
wherein said controller to determine whether data is in a higher or lower density mode and if the data is in a higher density mode, implements error correction and if the data is in a lower density mode, omits error correction.

28. The memory of claim 27 wherein said memory array is a multi-level flash memory array.

29. The memory of claim 27 said controller to allow overwriting when the data is stored in the lower density mode.

30. The memory of claim 29 said controller to prevent overwriting when the data is stored in the higher density mode.

31. The memory of claim 27 said controller to allow overwriting of stored data when error correcting code is not provided for that data.

32. The memory of claim 27 said controller to use at least two bits to represent four threshold voltage levels.

33. The memory of claim 32 said controller to use one of said bits as a more significant bit and the other of said bits as a less significant bit.

34. The memory of claim 33 said controller to group the more significant bits from different cells together.

35. A system comprising:
a processor;
a wireless interface; a memory coupled to said processor; and
a controller coupled to said memory to selectively store data in said memory at different densities per cell and to implement error correction depending on a density of data storage;
wherein said controller to determine whether data is in a higher or lower density mode and if the data is in a higher density mode, implements error correction and if the data is in a lower density mode, omits error correction.

36. The system of claim 35 wherein said memory is a multi-level flash memory.

37. The system of claim 35 said controller to allow overwriting when the data is stored in the lower density mode.

38. The system of claim 37 said controller to prevent overwriting when the data is stored in the higher density mode.

39. The system of claim 35 said controller to allow overwriting of stored when error correcting codes are not provided for that data.

40. The system of claim 35 said controller to use at least two bits to represent four threshold levels.

41. The system of claim 40 said controller to use one of said bits as a more significant bit and the other said bits as a less significant bit.

42. The system of claim 41 said controller to group the more significant bits from different cells together.

43. The system of claim 35 wherein said wireless interface includes an antenna.

44. The system of claim 43 wherein said wireless interface includes a dipole antenna.

* * * * *